United States Patent [19]

Shibutani

[11] Patent Number: 5,528,532

[45] Date of Patent: Jun. 18, 1996

[54] DISTORTION CIRCUITS FOR IMPROVING DISTORTION EFFECTS TO AUDIO DATA

[75] Inventor: Motoyuki Shibutani, Hamamatsu, Japan

[73] Assignee: Yamaha Corporation, Japan

[21] Appl. No.: 469,765

[22] Filed: Jun. 6, 1995

Related U.S. Application Data

[63] Continuation of Ser. No. 158,948, Nov. 29, 1993, abandoned.

[30] Foreign Application Priority Data

Nov. 30, 1992 [JP] Japan .................. 4-321004
Apr. 30, 1993 [JP] Japan .................. 5-104793

[51] Int. Cl.$^6$ ............................................. G06G 7/00
[52] U.S. Cl. .................................................. 364/807
[58] Field of Search ................................. 364/807, 825, 364/724.16; 381/94; 330/126

[56] References Cited

U.S. PATENT DOCUMENTS 3,784,749  1/1974  Shigeyama et al. .................. 381/94
3,803,357  4/1974  Sacks ........................................ 381/94
3,992,584  11/1976 Dugan .................................. 381/93 X
4,052,560  10/1977 Santmann ............................... 381/98
4,703,507  10/1987 Holden ................................... 381/94
4,868,878  9/1989  Kunugi et al. ............................ 381/1
5,131,044  7/1992  Brown, Sr. et al. ...................... 381/61
5,200,709  4/1993  Saito et al. .......................... 381/28 X

FOREIGN PATENT DOCUMENTS 64-2100    1/1989 Japan .
2-203393   8/1990 Japan .

Primary Examiner—Tan V. Mai
Attorney, Agent, or Firm—Graham & James

[57] ABSTRACT

A distortion circuit includes at least two distortion imparting circuits for respectively imparting different distortion characteristics to an input data, and an adder for adding output data from at least two distortion imparting circuits. When an input data having the required waveform is supplied to each of the distortion imparting circuits, the input data is respectively imparted with different distortion characteristics in each of the distortion imparting circuits. Then, the output signals from each distortion imparting circuits are added in the adder.

16 Claims, 6 Drawing Sheets

DISTORTION CIRCUITS FOR IMPROVING DISTORTION EFFECTS TO AUDIO DATA

This is a continuation of application Ser. No. 08/158,948, filed Nov. 29, 1993, now abandoned.

BACKGROUND OF THE INVENTION

1. Field of the Invention

The present invention relates to distortion circuits, and more particularly, to distortion circuits capable of imparting distortion effects to audio data such as a musical tone data.

2. Background Art

A distortion circuit imparting distortion effects to a digital audio data of a digital circuit, for example as shown in FIG. 7, which is comprised of a non-liner table 1 having the input/output characteristics shown as the curve b in FIG. 8, or comprised of an amplifying multiplier 2 multiplying an input data by an amplifying coefficient, and an attenuating multiplier 3 multiplying the multiplied result of the amplifying multiplier 2 by an attenuating coefficient as shown in FIG. 9.

When the sine wave data shown as the curve a in FIG. 8 is supplied to the non-liner table 1 shown in FIG. 7, output data on which is represented by a broken line of the curve c in FIG. 8 are distorted, and is output from the non-liner table 1. In contrast, when the sine wave data shown as the curve a in FIG. 10 is supplied to the amplifying multiplier 2 shown in FIG. 9, the sine wave data is multiplied by an amplifying coefficient of the amplifying multiplier 2. As a result, the part where an amplitude level is large among the parts of the multiplied result is limited by a limiter built into the amplifying multiplier 2. Then, the output data from the amplifying multiplier 2 is multiplied by the attenuating coefficient in the attenuating multiplier 3 to adjust the proper level. Accordingly, the output data wherein the waveform is distorted, is output as shown as the curve b in FIG. 10.

The amplifying multiplier 2 is composed of a multiplier 4 and a limiter 5 as shown in FIG. 11. Both an input bit width and an output bit width of the amplifying multiplier 2 is p bits (p is a positive integer). However, there is the case where the bit width of the multiplied result of the multiplier 4 becomes q bits (q is a positive integer, and p is less than q). Accordingly, when the bit width of the multiplied result of the multiplier 4 is larger than the output bit width p of the amplifying multiplier 2, the bit width of the multiplied result of the multiplier 4 is limited, by the limiter 5, to the maximum value or the minimum value of the output bit width p of the amplifying multiplier 2. For example, when the multiplied result of the multiplier 4 is a positive value and its bit width is larger than the output bit width p of the amplifying multiplier 2, the bit width of the multiplied result of the multiplier 4 is limited to the maximum value of the output bit width p of the amplifying multiplier 2 of the limiter 5. In contrast, when the multiplied result of the multiplier 4 is a negative value and its bit width is larger than the output bit width p of the amplifying multiplier 2, the bit width of the multiplied result of the multiplier 4 is limited, by the limiter 5, to the minimum value of the output bit width p of the amplifying multiplier 2.

As described above, the distortion effect is imparted to the sine wave data in the distortion circuit.

In the above-mentioned conventional distortion circuit, in the case of the distortion circuit shown in FIG. 7, there is a positive effect in that every distortion effect having every characteristic can be realized. However, there is a drawback in that memory such as a ROM having a large memory capacity is necessary and the circuit construction of the distortion circuit is complex. In contrast, in the case of the distortion circuit shown in FIG. 9, there is the positive effect in that the circuit construction is simple. However, because the distortion of the audio signal begins sharply, the musical forced distortion effect is imparted to the audio data. Accordingly, the distortion circuit shown in FIG. 9 is not suitable for using for an electronic musical instrument.

SUMMARY OF THE INVENTION

In consideration of the above problems, it is an object of the present invention to provide a distortion circuit which is capable of imparting a distortion effect to an audio data wherein sound distortion begins smoothly and is of simple construction.

To satisfy this object, the present invention provides a distortion circuit comprising at least two distortion imparting means for respectively imparting different distortion characteristics to an input data, and an adding means for adding output data from at least two said distortion imparting means.

According to such a structure, when an input data having the required waveform is supplied to each distortion imparting means, different distortion characteristics is respectively imparted to the input data in each distortion imparting means. Then, the output signals from each distortion imparting means are added in the adding means.

Furthermore, the present invention provides a distortion circuit comprising at least two distortion imparting means connected in series comprising a multiplying means for amplifying an input data and a limiting means for limiting an amplitude which is an output signals from said multiplying means and is larger than the required level, and an adding means for adding output data from at least two said distortion imparting means.

According to such a structure, when an input data having the required waveform is supplied to a pre-stage distortion imparting means, the input data is amplified in the multiplying means, and then an output data from the multiplying means is limited in the limiting means. Next, an output data from the pre-stage distortion imparting means is supplied to a post-stage distortion imparting means and is amplified in the multiplying means, and then an output data from the multiplying means is limited in the limiting means. Then, the output signals from each distortion imparting means are added in the adding means.

According to the present invention, there is the advantage in that distortion effects whereby sound distortion begins smoothly can be imparted to an audio data, and in that the distortion circuit can be simply constructed.

DETAILED DESCRIPTION OF THE PREFERRED EMBODIMENTS

Figure 1:
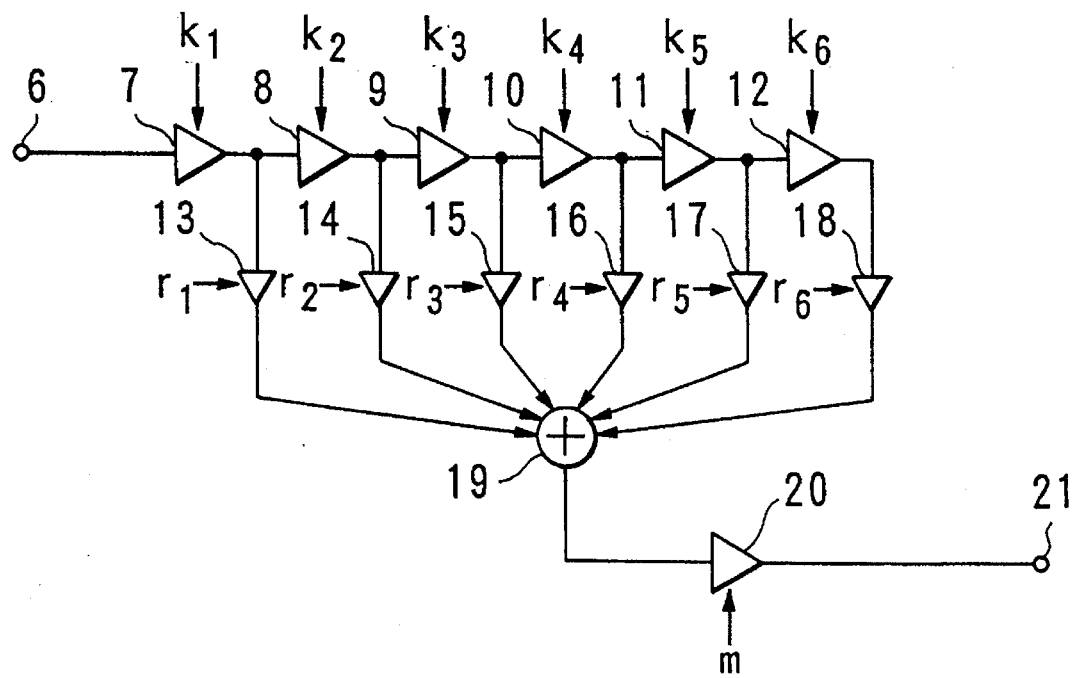
FIG. 1 shows a block diagram of the electrical structure of a distortion circuit based on the first preferred embodiment of the present invention.

Hereinafter, an explanation of the preferred embodiment of the present invention is given by referring to the figures. FIG. 1 shows a block diagram of the electrical structure of a distortion circuit based on the first preferred embodiment of the present invention. In this figure, an input terminal 6 is provided, to which a digital audio data is supplied. The digital audio data supplied via the input terminal 1 is supplied to the amplifying multipliers 7 through 12 which are connected in series and respectively multiply an input data by amplifying coefficients $k_1$ through $k_6$ ($k_1$ through $k_6 > 1$) in order to distort the input signal. Each output data from the amplifying multipliers 7 through 12 is supplied to each of the attenuating multipliers 13 through 18 which multiply the output data by each of the attenuating coefficients $r_1$ through $r_6$ ($0 < r_1$ through $r_6 < 1$). Each of the amplifying multipliers 7 through 12 is comprised of the same construction as the amplifying multiplier 2 shown in FIG. 2.

All output signals from each of the attenuating multipliers 13 through 18 are supplied to an adder 19 and are then added by it. An output data from the adder 19 is supplied to an adjusting multiplier 20 and is then multiplied by a level adjustment coefficient m. Thus, an output data from the adjusting multiplier 20 is delivered as an audio signal imparted a distortion effect from an output terminal 21. The attenuating coefficients $r_1$ through $r_6$ are coefficients for use in adjusting the level of each output signal from each of the attenuating multipliers 13 through 18 so that the added result of the adder 19 does not become equal to or larger than the maximum value of the output bit width.

The adjusting multiplier 20 multiplies the added result of the adder 19 by the level adjustment coefficient m to lower the level of the added result of the adder 19 so that the output level of the audio signal becomes appropriate in the case where the added result of the adder 19 becomes large. The adjusting multiplier 20 is used for adjusting the volume of the audio data imparted the distortion effect. Furthermore, the level adjustment coefficient m can be adjusted using, for example, an external distortion volume adjustment knob handled by a performer.

Figure 2:
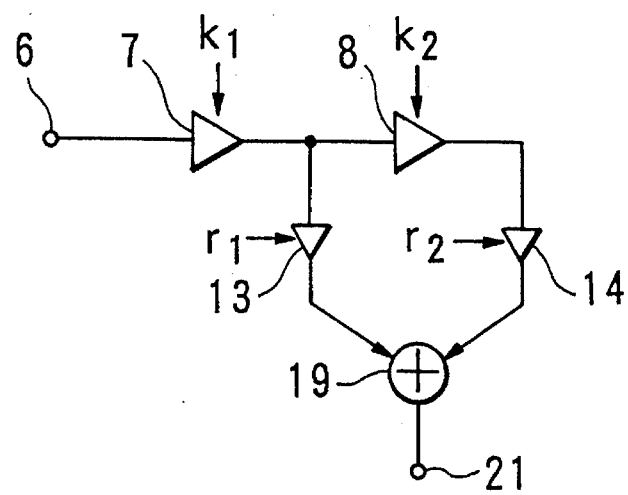
FIG. 2 shows a block diagram of the electrical structure of a distortion circuit comprising two-stage amplifying multipliers connected in series.

The distortion circuit having the electrical structure shown in FIG. 1 comprises six-stage amplifying multipliers connected in series. In contrast, FIG. 2 shows a block diagram of the electrical structure of a distortion circuit comprising two-stage amplifying multipliers connected in series. In this figure, components which correspond to components in the distortion circuit shown in FIG. 1 will retain the original identifying numeral, and their description will not be repeated.

Figure 3:
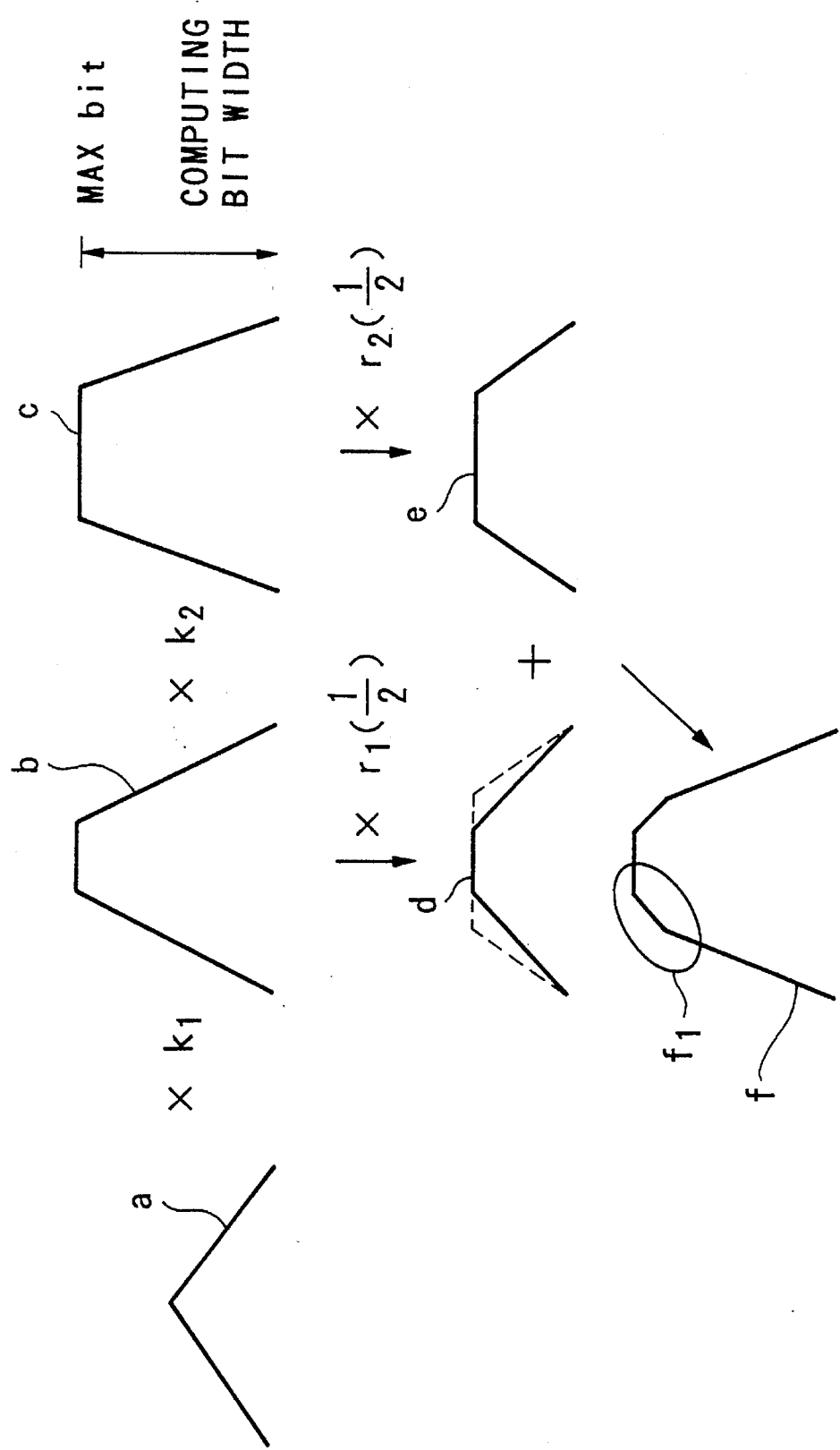
FIG. 3 shows waveforms for explaining the operation of the distortion circuit shown in FIG. 2.

In the above-described construction, when a chopping wave data, shown as the curve a in FIG. 3, is supplied to the input terminal 6 shown in FIG. 2, the chopping wave data is multiplied by the amplifying coefficient $k_1$ in the amplifying multiplier 7. Among the parts of the multiplied result of the amplifying multiplier 7, the part wherein a bit width is larger than the output bit width of the amplifying multiplier 7 is limited by a limiter built in the amplifying multiplier 7. Accordingly, the waveform of the output data from the amplifying multiplier 7 becomes the curve b shown in FIG. 3.

Next, the output data from the amplifying multiplier 7 is multiplied by the amplifying coefficient $k_2$ in the amplifying multiplier 8. Among the parts of the multiplied result of the amplifying multiplier 8, the part wherein a bit width is larger than the output bit width of the amplifying multiplier 8 is limited by a limiter built in the amplifying multiplier 8. Accordingly, the waveform of the output data from the amplifying multiplier 8 becomes the curve c shown in FIG. 3.

In contrast, the output data from the amplifying multiplier 7 is multiplied by the attenuating coefficient $r_1$, for example, ½ in the attenuating multiplier 13. Accordingly, the waveform of the output data from the attenuating multiplier 13 becomes the curve d shown in FIG. 3. Moreover, the output data from the amplifying multiplier 8 is multiplied by the attenuating coefficient $r_2$, for example, ½ in the attenuating multiplier 14. Accordingly, the waveform of the output data from the attenuating multiplier 14 becomes one the curve e shown in FIG. 3.

Then, each output data from each of the attenuating multipliers 13 and 14 are added in the adder 19. Accordingly, the waveform of the output data from the adder 19, namely, the output data from the output terminal 21 which the distortion effect is imparted, becomes the curve f shown in FIG. 3. In other words, as shown in FIG. 3, the characteristics of the part $f_1$ of the output waveform f is improved and the distortion of the waveform of the output data begins more smoothly than the waveform of the output data from the conventional distortion circuit. The larger the stage number of the amplifying multiplier, then the greater the attenuating multiplier is increased, and the better the improved characteristics of the beginning of the distortion of the output waveform. Furthermore, even if the value of the multiplied coefficients $k_1$ through $k_6$ multiplied in the amplifying multipliers 7 through 12 are small, since the multipliers are connected in series, the later the multipliers are, then the larger the distortion which can be obtained from the multipliers. Accordingly, the extra computing bit length of the multiplier are not necessary to compute.

Figure 4:
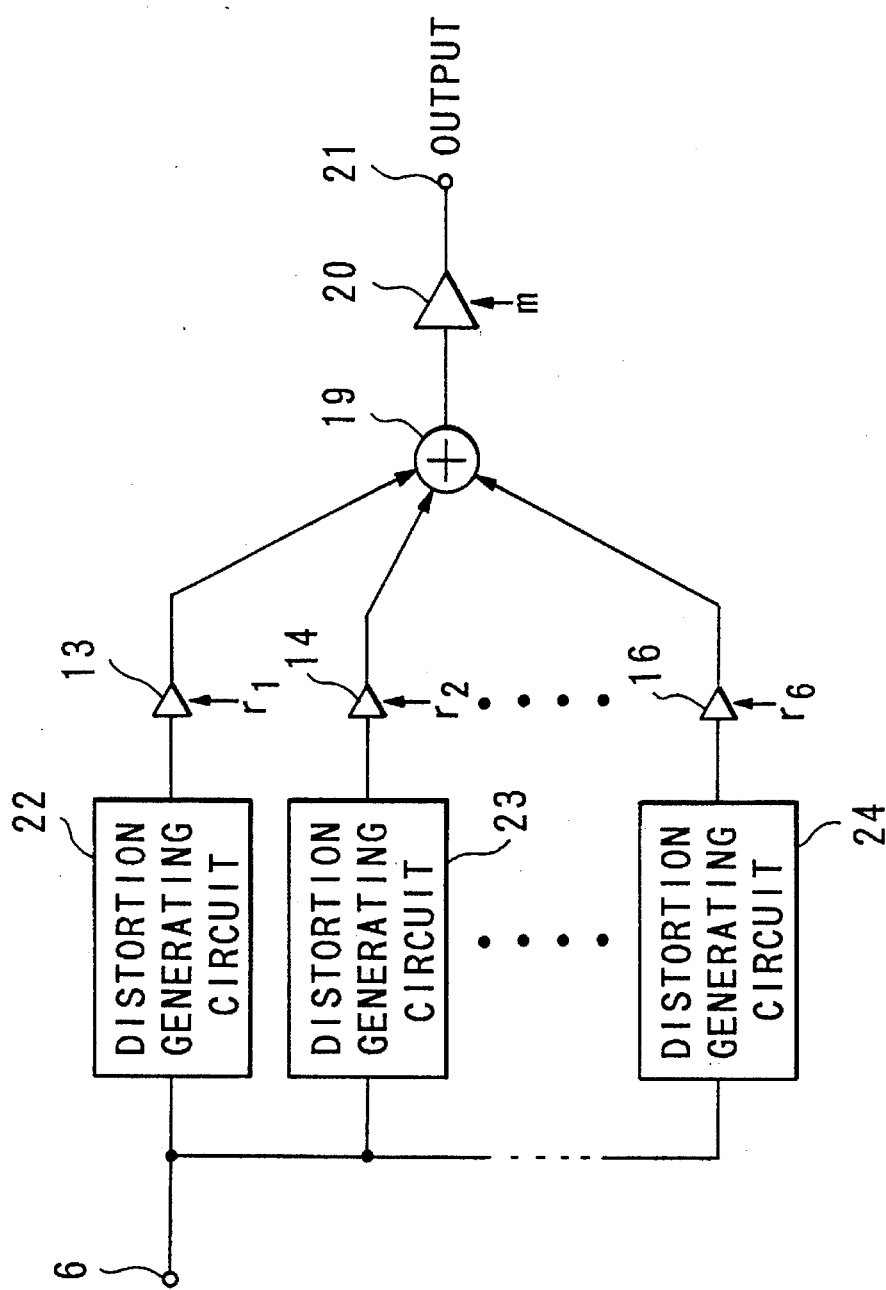
FIG. 4 shows a block diagram of the electrical structure of a distortion circuit based on the second preferred embodiment of the present invention.

Next, an explanation of a second preferred embodiment of the present invention will be described with reference to the figures. FIG. 4 shows a block diagram of the electrical structure of a distortion circuit based on the second preferred embodiment of the present invention. In this figure, components which correspond to components in the distortion circuit shown in FIG. 1 will retain the original identifying numeral, and their description will not be repeated. In FIG. 4, distortion generating circuits 22 through 24 are provided, wherein each point at the beginning of the distortion is different. For example, the distortion generating circuits 22 through 24 comprises the amplifying multipliers in the same way as the distortion circuit based on the first preferred embodiment of the present invention, and each of the amplifying multipliers has different coefficient. Accordingly, each point at the beginning of the distortion of each amplifying multiplier is different. Because the operation of the distortion circuit shown in FIG. 4 is nearly the same as the distortion circuit based on the first preferred embodiment of the present invention, the explanation of this distortion circuit will be omitted.

Figure 5:
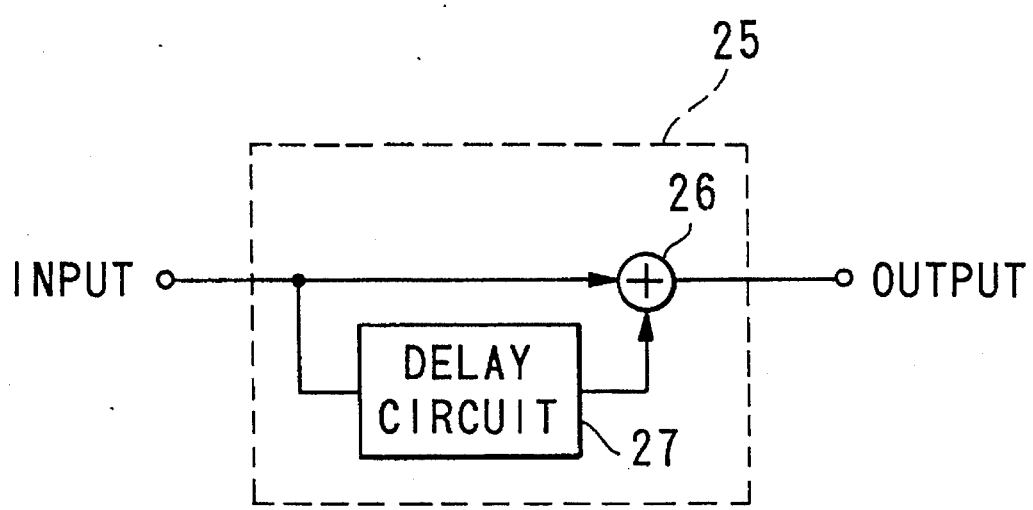
FIG. 5 shows an example of a block diagram of the electrical structure of a filter 25 of the first and second preferred embodiment of the present invention.
Figure 6:
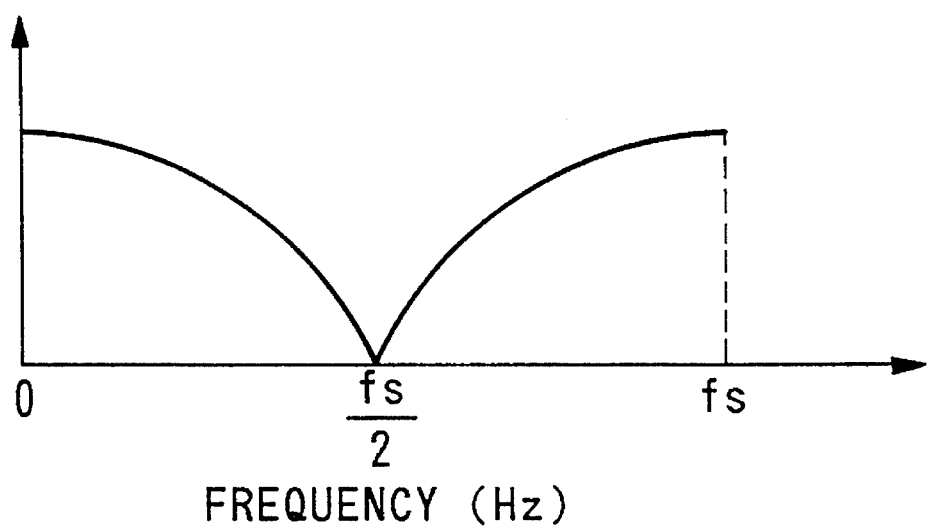
FIG. 6 shows an example of frequency characteristics of the filter 25 shown in FIG. 5.
Figure 7:
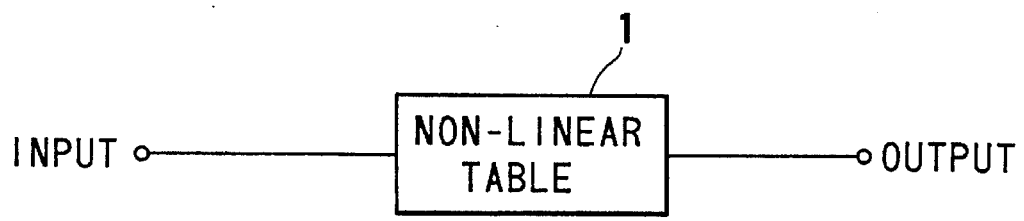
FIG. 7 shows a first example of a block diagram of the electrical structure of a conventional distortion circuit.
Figure 8:
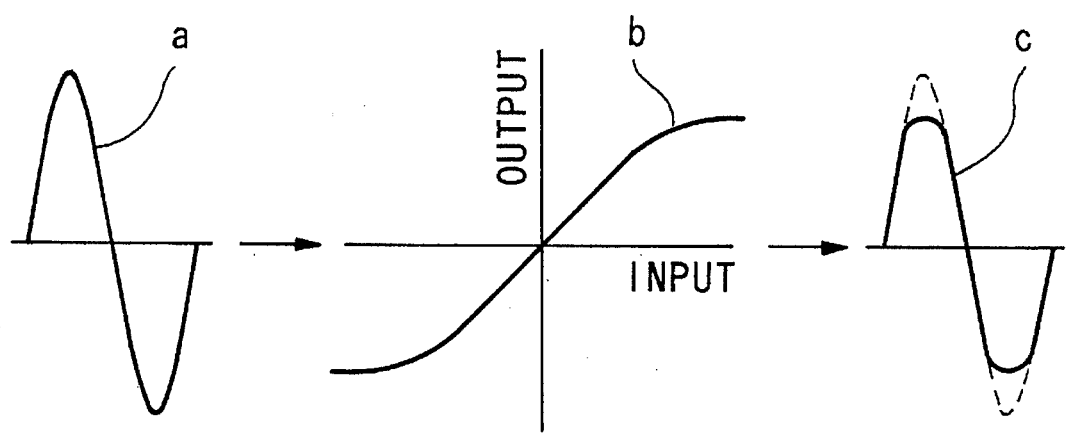
FIG. 8 shows waveforms for explaining the operation of the distortion circuit shown in FIG. 7.
Figure 9:
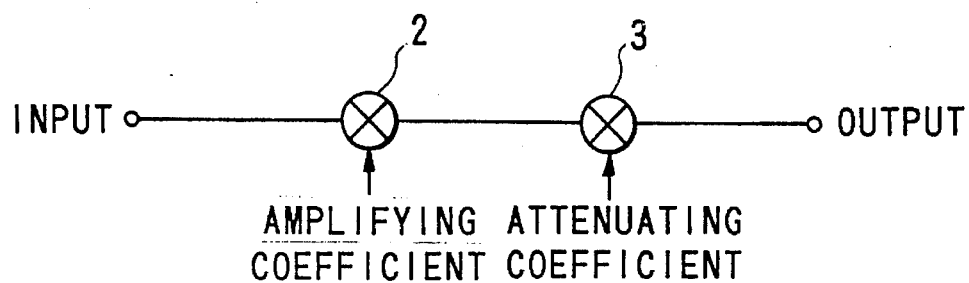
FIG. 9 shows a second example of a block diagram of the electrical structure of a conventional distortion circuit.
Figure 10:
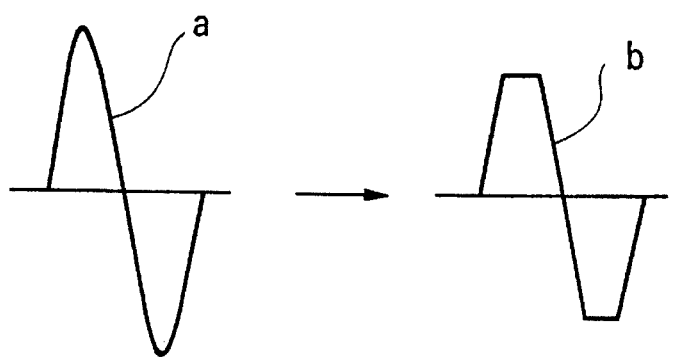
FIG. 10 shows waveforms for explaining the operation of the distortion circuit shown in FIG. 9.
Figure 11:
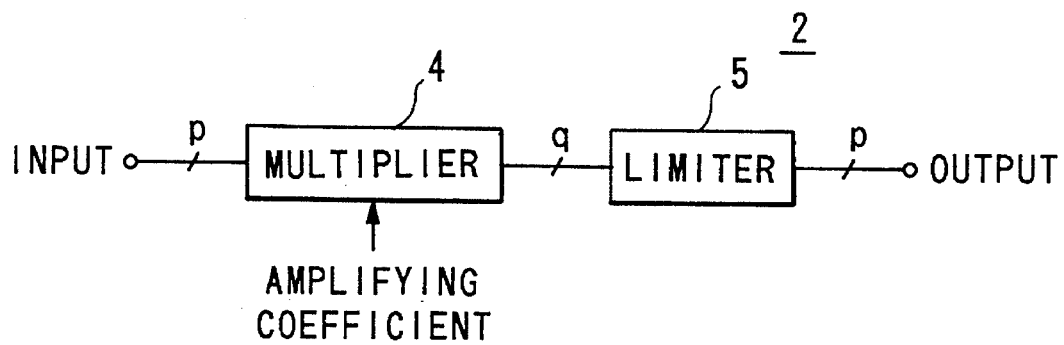
FIG. 11 shows an example of a block diagram of the electrical structure of an amplifying multiplier 2.

In the above-mentioned first and second embodiments of the present invention, when the distortion effect is imparted to the input data, harmonic components which is not be included in the input data generate. The harmonic components includes a lot of harmonic components which the performer does not desire to generate. Therefore, if filters such as low pass filters are connected to each output end of the amplifying multipliers 7 through 12 shown in FIG. 1, or the distortion generating circuits 22 through 24 shown in FIG. 4 (hereinafter, distortion imparting circuits will be referred to by its generic name), thereby the data which the performer does not desired are eliminated, and can be supplied to the distortion imparting circuit or the attenuating multipliers 13 through 18. In this case, if a filter 25 shown in FIG. 5 is used as the filter which eliminates the harmonic components in which the performer does not desire to generate, then it is able to eliminate the harmonic components with simpler construction and more effectively than the conventional filter. In FIG. 5, the output data from the distortion imparting circuit is divided and one part is supplied to one of the input ends of an adder 26 and the other part is supplied to a delay circuit 27 which delays an input data with a sampling period. Next, an output data from the delay circuit 27 is supplied to the other input end of the adder 26 and is added to one part of the output data from the distortion imparting circuit and thereby an output data from an output end of the adder 26 is output from the filter 25. If the sampling frequency of the filter 25 is frequency $f_s$, the filter 25 comprising the adder 26 and the delay circuit 27 has the characteristics of a comb filter, wherein a cosine waveform has the frequency $2f_s$ and is a full-wave rectified as shown in FIG. 6. For example, in the case where the sampling frequency $f_s$ is 32 kHz, an amplitude is equal to 0 at half of the sampling frequency $f_s$, namely, at 16 kHz and the filter 25 works as a low pass filter at a frequency range of 0 through 16 kHz.

Furthermore, in the above-mentioned first embodiment, the example is given in which, the amplifying multiplier is used to distort the input data; however, the present invention is not limited thereto. For example, it is also possible to use a shifter which shifts the bit of the input data and thereby realizes multiplication of the input data. In this case, a circuit construction is simpler than one of the distortion circuit of the first embodiment.

Moreover, in the above-mentioned first and second embodiments, the examples are given in which the filter 25 is connected to the output end of the distortion imparting circuit to eliminate the harmonic components which the performer does not desire; however, the present invention is not limited thereto. For example, it is also possible to be able to optionally set up the characteristics of the filter 25 by the performer. Thereby, because the harmonic component which the performer desires can be eliminated, it is possible to finely adjust tone color.

As described above, as the above-mentioned first embodiment of the present invention, in the case where a plurality of the distortion imparting circuits are connected in series, even if each distortion imparting circuit has the same characteristics, the data imparted different distortion effects can be obtained by deriving the output data from the different output ends of each of the distortion imparting circuits. Accordingly, it is not necessary to obtain the waveform having a large distortion from each distortion imparting circuit. Therefore, it is an advantage in that the computing bit length of the multiplier need not be increased.

Furthermore, in the above-mentioned first and second embodiment, harsh overtone components which result from imparting distortion effects to the input data can be effectively eliminated by filtering the output data from the distortion imparting circuit. In this case, when the filter 25 shown in FIG. 5 is used, since the overtone components can be eliminated with simple construction, in the case where these circuits comprise a digital data processor (DSP), the calculating step number can be decreased. In contrast, in the case where these circuits comprise hardware, circuit scale can be small and thereby the circuit cost can be lowered.

What is claimed is:

1. A distortion circuit comprising:
   at least two distortion imparting means for respectively imparting different distortion characteristics to respective input signals; and
   adding means for combining output signals from said at least two distortion imparting means to produce a combined output signal having distortion characteristics which are smoother than the distortion characteristics imparted by the at least two distortion imparting means.

2. A distortion circuit according to claim 1, further including at least two multiplying means for multiplying the output signals from said at least two distortion imparting means with at least one attenuating coefficient, said at least two multiplying means being respectively connected to respective inputs of said adding means.

3. A distortion circuit according to claim 1, further comprising multiplying means for multiplying the combined output signal from said adding means by an amplitude coefficient, and amplitude coefficient determining means for determining a value of said amplitude coefficient in accordance with an operation by a performer.

4. A distortion circuit according to claim 1, further comprising at least two filters respectively connected to respective outputs of said at least two distortion imparting means.

5. A distortion circuit according to claim 4 wherein each of said at least two filters comprises delay means for delaying the output signal from a respective one of said distortion imparting means by a predetermined time delay; and adding means for adding the output signal from said respective one of said distortion imparting means and an output signal from said delay means.

6. A distortion circuit according to claim 1, further including attenuating means for attenuating at least one of said plurality of distorted output signals in accordance with a predetermined attenuation coefficient.

7. A distortion circuit comprising:
   at least two distortion imparting means connected in series for imparting at least one distortion characteristic to a signal input thereto and providing respective output signals, said at least two distortion imparting means including multiplying means for amplifying said input signal and limiting means for limiting an amplitude of an output signal from said multiplying means; and
   adding means for adding said respective output signals from said at least two distortion imparting means and providing a summed output signal having distortion characteristics which are smoother than distortion characteristics imparted by the at least two distortion imparting means.

8. A distortion circuit according to claim 7, further comprising at least two multiplying means for multiplying said respective output signals from said at least two distortion imparting means by respective attenuating coefficients.

9. A distortion circuit according to claim 7, further comprising multiplying means for multiplying said summed output signal by an amplitude coefficient, and amplitude coefficient determining means for determining a value of said amplitude coefficient in accordance with an operation by a performer.

10. A distortion circuit according to claim 9, further including at least two filters respectively connected to respective outputs of said at least two distortion imparting means.

11. A distortion circuit according to claim 10, wherein each of said filters comprises delay means for delaying a respective output signal by a predetermined time delay to produce a delayed output signal; and adding means for adding a signal output from said distortion imparting means and the delayed output signal.

12. A distortion circuit comprising:

distortion means for respectively imparting a plurality of distortion characteristics to a corresponding plurality of input signals and outputting a plurality of distorted output signals; and adding means for combining said plurality of distorted output signals to produce a combined output signal having distortion characteristics which are smoother than the plurality of distortion characteristics imparted by the distortion means.

13. A distortion circuit according to claim 12, further comprising multiplying means for multiplying the combined output signal by an amplitude coefficient, and amplitude coefficient determining means for determining a value of said amplitude coefficient in accordance with an operation by a performer.

14. A distortion circuit according to claim 12, further comprising a plurality of filters for filtering said plurality of distorted output signals in accordance with predetermined filter characteristics.

15. A distortion circuit according to claim 14, wherein each of said plurality of filters comprises delay means for delaying a respective distorted output signal by a delay amount to produce a delayed signal; and adding means for combining one of said plurality of distorted output signals with said delay signal.

16. A distortion circuit according to claim 12, wherein each of said corresponding plurality of input signals comprises an audio signal.

* * * * *

UNITED STATES PATENT AND TRADEMARK OFFICE
CERTIFICATE OF CORRECTION

PATENT NO. : 5,528,532
DATED      : June 18, 1996
INVENTOR(S) : Motoyuki Shibutani It is certified that error appears in the above-indentified patent and that said Letters Patent is hereby corrected as shown below:

On the title page, item [54] and column 1, line 1, please delete "IMPROVING" and insert therefor --IMPARTING--.

Signed and Sealed this

Twenty-ninth Day of October 1996

Attest:

BRUCE LEHMAN

Attesting Officer

Commissioner of Patents and Trademarks